(12) United States Patent
Clevenger et al.

(10) Patent No.: US 7,402,532 B2
(45) Date of Patent: Jul. 22, 2008

(54) STRUCTURE TO IMPROVE ADHESION BETWEEN TOP CVD LOW-K DIELECTRIC AND DIELECTRIC CAPPING LAYER

(75) Inventors: Lawrence A. Clevenger, LaGrangeville, NY (US); Stefanie R. Chiras, Peekskill, NY (US); Timothy Dalton, Ridgefield, CT (US); James J. Demarest, Fishkill, NY (US); Derren N. Dunn, Fishkill, NY (US); Chester T. Dziobkowski, Hopewell Junction, NY (US); Philip L. Flaitz, Newburgh, NY (US); Michael W. Lane, Cortlandt Manor, NY (US); James R. Lloyd, Katonah, NY (US); Darryl D. Restaino, Modena, NY (US); Thomas M. Shaw, Peekskill, NY (US); Yun-Yu Wang, Poughquag, NY (US); Chih-Chao Yang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 11/499,220

(22) Filed: Aug. 4, 2006

(65) Prior Publication Data
US 2007/0148958 A1 Jun. 28, 2007

Related U.S. Application Data

(62) Division of application No. 10/827,693, filed on Apr. 19, 2004, now Pat. No. 7,102,232.

(51) Int. Cl.
*H01L 23/48* (2006.01)

(52) U.S. Cl. .............................. 438/783; 257/E21.576
(58) Field of Classification Search ................. 438/783, 438/789, 798; 257/E21.576
See application file for complete search history.

(56) References Cited

U.S. PATENT DOCUMENTS

| 6,147,009 | A | 11/2000 | Grill et al. |
| 6,251,770 | B1 | 6/2001 | Uglow et al. |
| 6,525,428 | B1 | 2/2003 | Ngo et al. |
| 6,570,256 | B2 | 5/2003 | Conti et al. |
| 6,974,762 | B2 | 12/2005 | Gracias et al. |
| 6,974,768 | B1 * | 12/2005 | Kailasam ..................... 438/625 |
| 2005/0170663 | A1 * | 8/2005 | Lu et al. ..................... 438/778 |

* cited by examiner

*Primary Examiner*—Lex Malsawma
(74) *Attorney, Agent, or Firm*—Scully, Scott, Murphy & Presser, P.C.; Robert M. Trepp, Esq.

(57) ABSTRACT

An interconnect structure in which the adhesion between an upper level low-k dielectric material, such as a material comprising elements of Si, C, O, and H, and an underlying diffusion capping dielectric, such as a material comprising elements of C, Si, N and H, is improved by incorporating an adhesion transition layer between the two dielectric layers. The presence of the adhesion transition layer between the upper level low-k dielectric and the diffusion barrier capping dielectric can reduce the chance of delamination of the interconnect structure during the packaging process. The adhesion transition layer provided herein includes a lower $SiO_x$- or SiON-containing region and an upper C graded region. Methods of forming such a structure, in particularly the adhesion transition layer, are also provided.

1 Claim, 2 Drawing Sheets

STRUCTURE TO IMPROVE ADHESION BETWEEN TOP CVD LOW-K DIELECTRIC AND DIELECTRIC CAPPING LAYER

RELATED APPLICATION

This application is a divisional of U.S. application Ser. No. 10/827,693, filed Apr. 19, 2004 now U.S. Pat. No. 7,102,232.

FIELD OF THE INVENTION

The present invention relates to semiconductor interconnect structures, and more particularly to semiconductor interconnect structures that include an upper low-k dielectric, such as a carbon-doped oxide (i.e., dielectric that includes Si, C, O and H; hereinafter SiCOH), that is located on a diffusion barrier capping dielectric layer, such as a diffusion barrier capping layer that includes C, Si, N and H (hereinafter CSiNH). In the interconnect structure of the present invention, improved adhesion between the upper low-k dielectric and the diffusion barrier capping dielectric is achieved by providing an adhesion transition layer between the two dielectric materials. The present invention also provides various methods for forming such an interconnect structure.

BACKGROUND OF THE INVENTION

The continuous shrinking in dimensions of electronic devices utilized in ultra-large scale integrated (ULSI) circuits in recent years has resulted in increasing the resistance of the back-end-of-the-line (BEOL) metallization without concomitantly decreasing the interconnect capacitances. Often interconnects are even scaled to higher aspect ratios to mitigate the resistance increases, leading to increased capacitance. This combined effect increases signal delays in ULSI electronic devices. In order to improve the switching performance of future ULSI circuits, low dielectric constant (k) dielectrics and particularly those with k significantly lower than silicon dioxide are being introduced to reduce the capacitance.

The low-k materials that have been considered for applications in ULSI devices include polymers containing Si, C, and O, such as methylsiloxane, methylsilsesquioxanes, and other organic and inorganic polymers which are fabricated by spin-on techniques or, Si, C, O and H containing materials (SiCOH, SiOCH, carbon-doped oxides (CDO), silicon-oxycarbides, organosilicate glasses (OSG)) deposited by plasma enhanced chemical vapor deposition (PECVD) techniques.

The incorporation of the low-k dielectrics in the interconnect structures of integrated circuits (IC) often requires the use of other dielectric materials as diffusion barrier caps or etch-stop and chemo-mechanical polishing (CMP) hardmasks. The adhesion among the different layers in the complex structures of an IC device is often too low, resulting in delaminations during the processing of the device, or reduced reliability in response to thermomechanical stresses imposed by typical chip packaging materials.

FIG. 1 shows a typical prior art interconnect structure 10 that includes a lower level chemical vapor deposited (CVD) low-k SiCOH dielectric 12 and an upper level CVD low-k SiCOH dielectric 20. Each of the dielectric levels 12 and 20 includes metal wiring regions 14 formed therein. The metal wiring regions 14 are capped with a diffusion barrier capping dielectric 18 that is comprised of a dielectric containing C, Si, N and H (i.e., CSiNH).

Due to the CSiNH pre-cleaning process, which includes a $NH_3$ pretreament, each of the SiCOH surfaces form a thin layer of SiON 16. The SiON layer 16 includes the following three regions: an upper region which is near the interface of the CSiNH capping dielectric 18 that is nitrogen rich SiON, a middle region that is oxygen rich SiON, and a lower region that is carbon depleted. The carbon depleted region extends continuously into an upper surface region of each SiCOH dielectric.

In the packaging process, a crack typically forms between the CSiNH capping dielectric 18 and the upper SiCOH dielectric 20, which indicates that the interface 19 between the CSiNH capping dielectric 18 and the upper SiCOH dielectric 20 is weak. Moreover, under stress, delamination of the CSiNH capping dielectric 18 and the upper SiCOH dielectric 20 may occur at interface 19. Adhesion tests show that the interface 19 between the CSiNH capping layer 18 and the upper level SiOCH dielectric 20 has a poor adhesion coefficient; the same test show that the adhesion coefficient between the lower dielectric 12 and the CSiNH capping layer 18 is improved due to the presence of the SiON layer. The current adhesion between the upper level SiCOH dielectric 20 and the underlying CSiNH capping layer 18 is in the range of 2 to 4 $J/m^2$, which is below the value of the cohesive strength of SiCOH material (6 $J/m^2$).

In view of the problems mentioned above with the current interconnect structure shown in FIG. 1, there is a need for providing an interconnect structure in which the adhesion between the upper level low-k dielectric and the underlying diffusion barrier capping dielectric is improved.

SUMMARY OF THE INVENTION

The present invention provides an interconnect structure in which the adhesion between an upper level low-k dielectric material (having a dielectric constant of less than 4.0), such a dielectric comprising elements of Si, C, O, and H, and an underlying diffusion capping dielectric layer, such as a capping layer, comprising elements of C, Si, N and H, is improved by incorporating an adhesion transition layer between the two dielectric layers. The diffusion barrier capping dielectric layer is typically located atop the interconnect wiring levels. The presence of the adhesion transition layer between the upper level low-k dielectric and the capping dielectric layer can reduce the chance of delamination of the interconnect structure during the packaging process.

Specifically, and in broad terms, the present invention relates to an interconnect structure that includes at least an upper low-k dielectric material and an underlying diffusion barrier capping dielectric layer, wherein an adhesion transition layer that comprises a lower $SiO_x$- or -containing region and an upper C graded region is located between the upper low-k dielectric material and the underlying diffusion barrier capping dielectric. In some embodiments of the present invention, the upper low-k dielectric material is a material comprising elements of Si, C, O and H, while the diffusion barrier capping dielectric layer comprises elements of C, Si, N and H. In other embodiments, the N is optional in the diffusion barrier capping dielectric layer.

In accordance with the present invention, the upper C graded region of the adhesion transition layer is C depleted near the interface of the adhesion transition layer ($SiO_x$- or SiON-containing region). Hence, in the upper C graded region, the content of C decreases the closer it gets to the upper low-k dielectric material. That is, the transition layer is C depleted next to the upper low-k dielectric hence maximizing the areal density of the Si—O bonds.

The present invention also relates to various methods of forming the interconnect structure of the present invention. In one embodiment of the present invention, a diffusion barrier capping dielectric, preferably comprising elements of C, Si, N and H, is first formed atop a lower level low-k dielectric material, preferably comprising elements of Si, C, O and H. After formation of the diffusion barrier capping dielectric, an argon plasma pretreatment process is used to form the adhesion transition layer of the present invention and thereafter the upper level low-k dielectric material is formed. Specifically, the argon pretreatment step occurs during the initial stage of forming the upper level low-k dielectric material.

In another embodiment of the present invention, a diffusion barrier capping dielectric, such as a material comprising elements of C, Si, N and H, is first formed atop a lower level low-k dielectric material, such as a material comprising elements of Si, C, O and H. After formation of the diffusion barrier capping dielectric, the diffusion barrier capping dielectric is subjected to an oxygen plasma process that converts a top surface region of the diffusion barrier capping dielectric into a SiO-containing layer. The SiO-containing layer may be composed of $SiO_x$ or SiON. Next, an argon plasma pretreatment process is employed to form the C graded region of the adhesion transition layer and thereafter the upper level low-k dielectric material is formed. As in the prior embodiment, the argon pretreatment step occurs during the initial stage of forming the upper level low-k dielectric material.

In yet another embodiment of the present invention, a diffusion barrier capping dielectric, such as a material comprising elements of C, Si, N and H, is first formed atop a lower level low-k dielectric material, such as a material comprising elements of Si, C, O and H. After formation of the diffusion barrier capping dielectric, a SiO-containing layer is formed on the diffusion barrier cap dielectric. The SiO-containing layer forms a portion of the inventive adhesion transition layer. Next, an oxygen plasma pretreatment process is employed to form the C graded region of the adhesion transition layer and thereafter the upper level low-k dielectric material is formed. As in the previous embodiments, the plasma pretreatment step occurs during the initial stage of forming the upper level low-k dielectric material.

DETAILED DESCRIPTION OF THE INVENTION

As stated above, the present invention provides an adhesion transition layer between a diffusion barrier layer and an interlevel dielectric having a dielectric constant lower than 4.0. In general, diffusion barrier layers located on top of Cu dielectrics contain N and more recently C. The carbon incorporation into the diffusion barrier layer can result in poor adhesion as C typically forms weak bonds with other elements. Also, the incorporation of N into the diffusion barrier layer, leads to a denser film (than silicon dioxide, for example) because the trivalent N generally replaces the bivalent O. As a result, a film with better diffusion barrier properties than silicon dioxide is obtained. The film also in general has a higher modulus and is more difficult to modify because of its relative inertness. Accordingly, the present invention provides for an inventive process which assures good adhesion between a relatively inert diffusion barrier layer and a more reactive low-k dielectric as compared to the diffusion barrier layer (the dielectric constant of the materials is a good measure of the ability to chemically modify the film with lower k films being more easily modified). The good adhesion is ensured by carefully controlling the ratio of Si—O bonds throughout the adhesion enhancement layer. The requirement is that the ratio of Si—O bonds be highest next to the diffusion barrier layer. This level of Si—O bond density may stay the same or may decrease as the graded interface layer approaches the low-k dielectric but it must remain higher than the Si—O bond density in the low-k dielectric. Having an interface transition layer with this chemistry provides for an easily modifiable film that guarantees good adhesion between the diffusion barrier layer and the low-k film when an Ar plasma is used during the initial deposition of the graded layer as described previously.

The present invention will now be described in greater detail. In the following discussion, the diffusion barrier layer is comprised of C, Si, N and H, while the low-k dielectric is comprised of Si, C, O and H. Although these materials are described and illustrated, other diffusion barrier materials and other low-k dielectrics can be employed so as long as the low-k dielectric is more reactive than the diffusion barrier layer. In the embodiment illustrated, an adhesion transition layer is provided that improves the adhesion of an upper level low-k dielectric material comprising elements of Si, C, O and H to a diffusion barrier capping dielectric comprising elements of C, Si, N and H. This embodiment of the present invention is depicted in FIG. 2.

Figure 1:
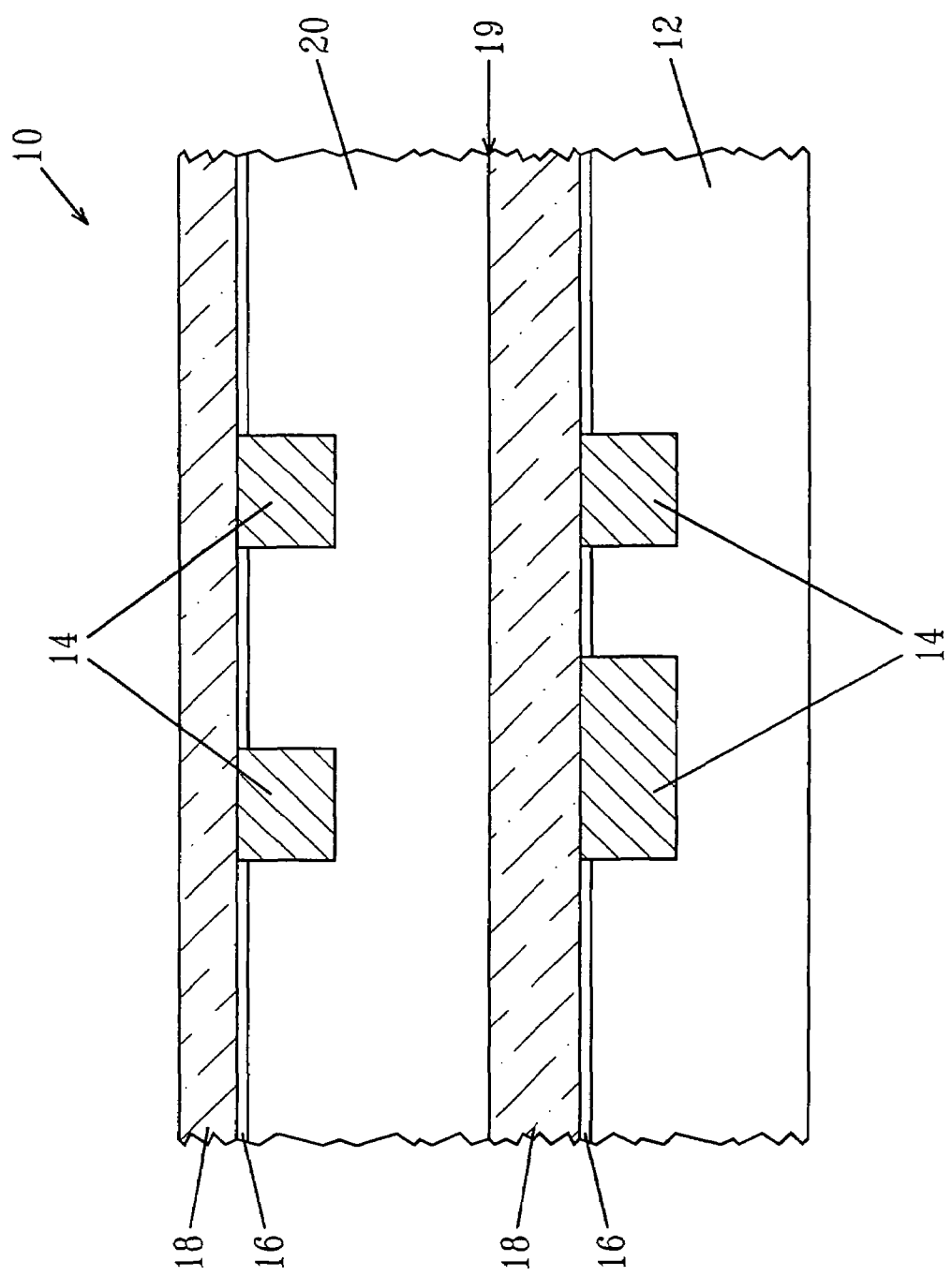
FIG. 1 is a pictorial representation (through a cross sectional view) showing a prior art interconnect structure in which poor adhesion exists between the upper dielectric level and the underlying diffusion barrier cap layer.
Figure 2:
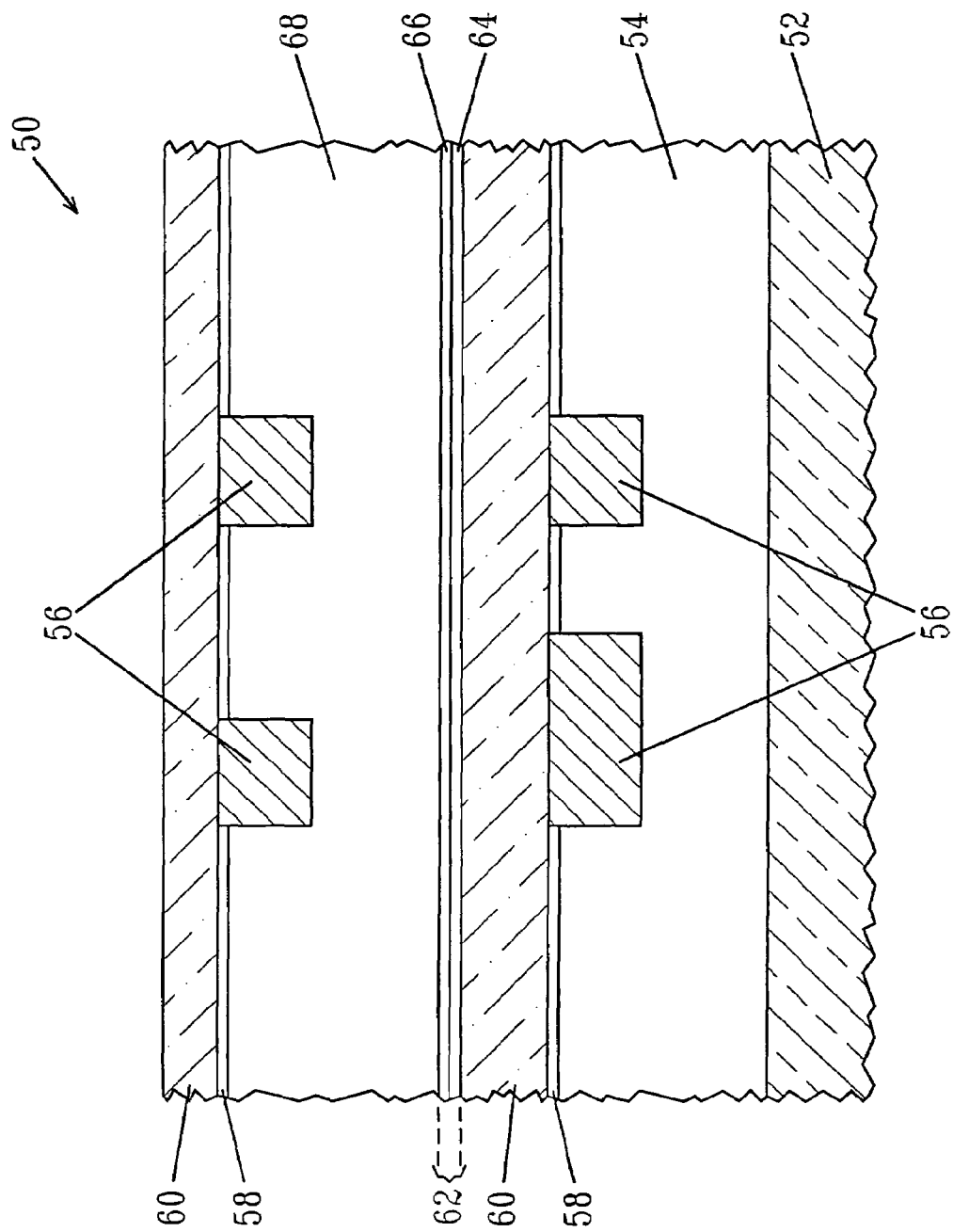
FIG. 2 is a pictorial representation (through a cross sectional view) showing an interconnect structure of the present invention.

FIG. 2 illustrates the interconnect structure 50 of the present invention. The interconnect structure 50 of the present invention includes a lower level low-k dielectric material 54 that comprises elements of Si, C, O and H located atop a substrate 52. Substrate 52 may be a semiconductor substrate, a dielectric layer, a metal layer or any combination thereof.

The lower level low-k dielectric 54 includes one or more wiring regions 56 located therein. The wiring regions 56 are typically filled with a conductive metal such as Al, Cu, W, or alloys thereof. A diffusion barrier 58 comprising $SiO_2$ or SiON is located on surfaces of the lower level low-k dielectric 54 that do not include wiring regions 56.

The interconnect structure 50 of the present invention also includes a diffusion barrier capping dielectric 60 comprising elements of C, Si, N and H located atop the lower level low-k dielectric 54. The inventive adhesion transition layer 62, which includes a lower $SiO_x$- or SiON-containing region 64 and an upper C graded region 66, is located atop the diffusion barrier capping dielectric 60. An upper level low-k dielectric 68 comprising elements of Si, C, O and H is located directly above the inventive adhesion transition layer 62. The upper level low-k dielectric 68 also includes one or more wiring regions 56 located therein. Atop of the upper level low-k dielectric 68 is another diffusion barrier 58 and another diffusion barrier capping dielectric 60.

In the interconnect structure 50 of the present invention, improved adhesion between the upper level low-k dielectric 68 and the underlying diffusion barrier capping dielectric 60 is obtained due to the present of the inventive adhesion transition layer 62. Specifically, the improved adhesion obtained in the present invention can be attributed to different bonding that is achieved between the inventive adhesion transition layer 62, the upper level low-k dielectric 68 and the diffusion barrier capping dielectric 60. In particular, the upper C graded region 66 of the inventive transition layer, which is in contact with the upper level low-k dielectric 68, provides a strong bond to the upper level low-k dielectric 68, while the lower SiO$_x$- or SiON-containing region 64, which is in contact with the underlying diffusion barrier capping dielectric 60, provides a strong bond to the diffusion barrier capping dielectric.

In accordance with the present invention, even greater adhesion may be obtained when the upper C graded region is deplete of C at the interface with the lower SiO$_x$- or SiON-containing region 64.

The interconnect structure 50 shown in FIG. 2 minus the inventive adhesion transition layer 62 is formed using conventional BEOL processes that are well known to those skilled in the art. For example, the lower level low-k dielectric 54 comprising elements of Si, C, O, and H is formed using plasma-enhanced chemical vapor deposition (PECVD), wherein at least one SiCOH-containing precursor, such as tetramethylcyclotetrasiloxane (TMCTS), octamethylcyclotetrasiloxane (OMCTS), diethoxymethylsilane (DEMS), diethoxyldimethylsilane (DEDMS) and other related cyclic and non-cyclic silanes and siloxanes, is employed. The SiCOH-containing precursor may be used in conjunction with an inert gas such as He or Ar and/or a reactant gas such as H$_2$O, O$_2$, CO$_2$.

In the present application, the term "low-k" is used to denote a dielectric that has a dielectric constant that is less than 4.0, preferably less than 3.7.

The details of the deposition as well as the various precursor materials that can be used in forming the lower level low-k dielectric 54 are described, for example, in co-assigned U.S. Pat. Nos. 6,147,009; 6,312,793; 6,441,491; 6,437,443; 6,441,491; 6,541,398; 6,479,110 and 6,497,693. The contents of each of the aforementioned patents are incorporated herein by reference.

The diffusion barrier 58 comprising SiO$_2$ or SiON is formed atop the lower level low-k dielectric 54 by using a conventional deposition process such as chemical vapor deposition, plasma-enhanced chemical vapor deposition, chemical solution deposition, atomic layer deposition, and other like deposition processes. Alternatively, the diffusion barrier 58 is formed by a thermal oxidation or thermal nitridation process. In yet another alternative embodiment, the diffusion barrier 58 is formed after formation of the wiring regions during the surface cleaning of the lower level low-k dielectric 54 prior to deposition of the diffusion barrier capping dielectric 60.

Then at least one wiring region 56 is formed by lithography and etching which forms an opening (line or via) through at least an upper portion of the lower level low-k dielectric 54. After providing the opening, the opening is typically lined with a diffusion liner material (not shown), such as TiN, Ta, and TaN, and the opening is filled with a conductive metal. The conductive metal is then planarized to the upper surface of either the diffusion barrier 58 or to the upper surface of the lower level low-k dielectric 54.

If not previously formed, the diffusion barrier 58 may be formed at this point of the present invention by subjecting the exposed portions of the lower level low-k dielectric 54 not containing wiring regions 56 to a plasma of NH$_3$. The NH$_3$ plasma treatment step forms an upper region which is near the interface of the diffusion barrier capping dielectric 60 that is nitrogen rich SiON, a middle region that is oxygen rich SiON, and a lower region that is carbon depleted. The carbon depleted region extends continuously into an upper surface region of the lower level low-k dielectric 54.

The diffusion barrier capping dielectric 60 comprising elements of C, Si, N and H is then formed atop the planarized structure utilizing techniques that are well known to those skilled in the art. For example, the diffusion barrier capping dielectric 60 is typically formed by PECVD wherein at least one SiCNH-containing precursor is introduced into a reactor containing the planarized structure and thereafter the precursor gas is converted into a plasma which is used for deposition. SiCNH films are typically formed with the use of trimethylsilane and helium gasses with an addition of ammonia in order to provide nitrogen doping of this film.

Next, the inventive adhesion transition layer 62 is formed on the diffusion barrier capping dielectric 60. The details concerning the various processes that can be used in forming the inventive adhesion transition layer 62 will be described in more detail hereinbelow.

After forming the adhesion transition layer 62, the upper level low-k dielectric 68 comprising elements of Si, C, O and H and wiring regions 56 are then formed as discussed above. Diffusion barrier 58 may be formed prior to forming the wiring regions or after forming the wiring regions during a precleaning process for deposition of the diffusion barrier capping layer 60.

The above steps may be repeated multiple times to provide a multi-layer interconnect structure wherein the inventive adhesion transition layer 62 is located between each diffusion barrier capping dielectric and its corresponding overlying low-k dielectric.

The adhesion transition layer 62 of the present invention, which includes a lower SiO$_x$- or SiON-containing region 64 and an upper C graded region 66, can be formed utilizing three various embodiments. The total thickness of the adhesion transition layer 62 of the present invention is typically from about 2 to about 70 nm, with a total thickness from about 5 to about 30 nm being more typical.

The thickness of the lower SiO$_x$- or SiON-containing region 64 of the inventive adhesion transition layer 62 is typically from about 1 to about 20 nm, with a thickness from about 2 to about 10 nm being more typically. The upper C graded region 66 of the inventive adhesion transition layer 62 of the present invention typically has a thickness from about 1 to about 50 nm, with a thickness from about 5 to about 20 nm being more typical. The term "C graded region" denotes that the region 64 includes a variable C content which decreases as it gets closer to the interface of the lower SiO$_x$- or SiON-containing region 64. In preferred embodiments of the present invention, C is depleted at or near a region in proximity with the interface of the lower SiO$_x$- or SiON-containing region 64 and increases through the graded region to the C content in the SiCOH upper low-k dielectric 68.

In one embodiment of the present invention, the adhesion transition layer 62 is formed by performing an Ar plasma pretreatment process during the initial deposition of the overlying upper level low-k dielectric 68. Specifically, after forming the diffusion barrier capping dielectric 60, an Ar plasma surface pretreatment process is performed during the initial stages of depositing the upper level-low-k dielectric 68. In the Ar pretreatment process, Ar gas is introduced into a reactor that can generate a plasma and thereafter it is converted into a plasma. The Ar gas may be used alone or in conjunction with an inert gas such as N, He, Xe or Kr. The flow rate of the Ar surface pretreatment gas may vary depending on the reactor system being used. The chamber pressure can range anywhere from 0.05 to 20 torr, but the preferred range of pressure operation is 1 to 10 torr. The Ar plasma pretreatment step occurs for a period of time which is typically from about 5 to about 60 seconds.

An RF power source is typically used to generate an Ar plasma of the surface pretreatment gas. The RF power source may operate at either the high frequency range (on the order of about 100 W or greater); the low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.0 to 1.0 W/cm$^2$ but the preferred range of operation is 0.2 to 0.5 W/cm$^2$. The chosen power levels must be low enough to avoid significant sputter etching of the exposed dielectric surface (<5 nanometers removal).

After the Ar plasma pretreatment process, the precursor gases for depositing the upper level low-k dielectric are introduced into the reactor.

In another embodiment of the present invention, the adhesion transition layer 62 is formed by performing an O$_2$ plasma step that converts a surface region of the diffusion barrier capping dielectric into a SiO-containing region, and then performing an Ar plasma pretreatment process during the initial deposition of the overlying upper level low-k dielectric 68.

In the O$_2$ plasma step, an oxygen-containing gas such as O$_2$ is introduced into a reactor that can generate a plasma and thereafter it is converted into a plasma. The O$_2$ gas may be used alone or in conjunction with an inert gas such as Ar, Ne, He, Xe or Kr. The flow rate of the surface treatment gas may vary depending on the reactor system being used. The chamber pressure can range anywhere from 0.05 to 20 torr, but the preferred range of pressure operation is 1 to 10 torr. The O$_2$ treatment step occurs for a period of time which is typically from about 5 to about 60 seconds.

An RF power source is typically used to generate an O$_2$ plasma of the surface treatment gas. The RF power source may operate at either the high frequency range (on the order of about 100 W or greater); the low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.0 to 1.0 W/cm$^2$ but the preferred range of operation is 0.2 to 0.5 W/cm$^2$. The chosen power levels must be low enough to avoid significant sputter etching of the exposed dielectric surface (<5 nanometers removal).

After the treatment of the diffusion barrier capping dielectric with an O$_2$ plasma, the first embodiment described above, i.e., Ar pretreatment during the initial stages of depositing the upper level low-k dielectric, is employed.

In yet another embodiment of the present invention, a SiO-containing layer is first formed on a surface of the diffusion barrier capping dielectric 58 by a conventional deposition process or by a thermal growth process. Next, the upper level low-k dielectric 68 is deposited using an initial O$_2$ plasma treatment process to reduce the C content in the first few nanometers of the deposited upper level low-k dielectric 68. The O$_2$ plasma conditions mentioned above in the second embodiment of the present invention can be used in this embodiment. It is noted that the SiO-containing layer forms the lower region 64 of the inventive adhesion transition layer 62, while the O$_2$ plasma pretreatment process that occurs during the initial deposition of the upper level low-k dielectric forms the upper C graded region 66 of the inventive adhesion transition layer 62.

As stated above, the adhesion transition layer 62 of the present invention increases the adhesion between the diffusion barrier capping dielectric 58 and the overlying upper level low-k dielectric 68. Measured adhesion values that can be obtained from the present invention are about 5 J/m$^2$ or greater. This measured adhesion for the samples of the present invention are higher than those in which no adhesion layer is present between the diffusion barrier capping dielectric and the upper level low-k dielectric. In the prior art in which no adhesion layer is present, the measured adhesion is in the range of 2.0 to 3.8 J/m$^2$.

The following example is presented to illustrate the fabrication of the adhesion transition layer of the present invention as well as to demonstrate advantages that can be obtained therefrom.

EXAMPLE

To investigate the effectiveness of an Ar sputter clean, samples were subjected to various sputter conditions, and in particular, controlled phasing from the Ar to the SiCOH precursor material so as to obtain a clean CSiNH surface, C depletion in the initial SiCOH, and a grading of the SiCOH composition into the bulk composition. Using 4-point bend testing, SiCOH samples prepared from OMCTS precursor clearly showed differences in adhesion strength.

The structures obtained were analyzed by Auger, TOF-SIMS and TEM/EELS to understand the chemistry of the interface. All samples with improved adhesion showed clear depletion of the C at the CSiNH/SiCOH interface and a grading of the C content in the SiCOH up to the base composition over approximately 7-12 nm. The analyses also show an increase in O content in the region of the most significant C depletion.

For the highest adhesion strength sample, it was found that an interface layer of SiO$_2$ essentially free of C had been formed at the interface. These results are demonstrated in the following three samples which were prepared together with only differences in the Ar plasma treatment prior to SiCOH deposition.

The first sample was standard SiCOH deposition without any Ar grading; the measured adhesion was 3.8 J/m$^2$. The EELS analysis shows a direct transition in C from the level found in the CSiNH to that in the SiCOH. A second sample was given one type of Ar plasma clean and achieved an adhesion of 4.3 J/m$^2$. Analysis of this structure shows a distinct drop in C at the interface and a gradual rise to the expected level of C in SiCOH. This type of profile was typical of most of the Ar preclean samples, i.e., a distinct drop in C at the interface and gradual rise to standard C level. The third sample shown, with a different Ar pretreatment, achieved the highest adhesion measured, 6.0 J/m$^2$. Analysis of this sample shows that the C at the interface decreased to the detection limit, i.e., <1%, leaving a SiO$_2$ interface layer ~5 nm thick. Above that layer, the C rose to the typical content over ~10 nm in a graded region.

These results lead the applicants to propose that the best method for improving the adhesion of SiCOH to CSiNH involves the presence of oxide layer at the interface and a region of SiCOH with graded C composition of ~5-20 nm above this. The oxide layer can be formed in-situ during the process, as done in these experiments, or formed previously by either thermal oxidation of CSiNH or deposition of a thin TEOS or similar oxide. The Ar grading serves to both remove surfaces adsorbed atmospheric hydrocarbons and to grade the C content during the initial SiCOH deposition.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The example given is intended only to be illustrative rather than exclusive.

What is claimed is:

1. A method of forming an interconnect structure comprising:

forming an adhesion transition layer on a surface of a diffusion barrier capping dielectric, including elements of C, Si and H, said adhesion transition layer comprising a lower $SiO_x$- or SiON-containing region and an upper C graded region, said forming the adhesion layer comprises (i) subjecting the barrier diffusion capping dielectric to an oxygen plasma process at an operation pressure from 0.05 to 20 torr for a period of time from about 5 to about 60 seconds to convert a top surface region of the diffusion barrier capping dielectric into a SiO-containing layer, said oxygen plasma process further includes generating an oxygen plasma from an oxygen gas that is admixed with an inert gas utilizing an RF power source, and (ii) performing an argon plasma pretreatment process during an initial stage of a subsequent step of forming of a low-k dielectric material that includes atoms of Si, C, O and H, said argon pretreatment process is performed at an operation pressure from 0.05 to 20 torr for a period of time from about 5 to about 20 second utilizing an argon plasma generated from Ar gas that is admixed with N, He, Xe or Kr utilizing an RF power source; and forming said low-k dielectric having a dielectric constant of less than 4.0 atop the adhesion transition layer, wherein an interface of said low-k dielectric is in contact with the upper C graded region of the adhesion transition layer.

* * * * *